(12) United States Patent
Wilson et al.

(10) Patent No.: US 10,453,580 B1
(45) Date of Patent: Oct. 22, 2019

(54) WINDOWS WITH INVISIBLE PATTERNED CONDUCTIVE LAYERS

(71) Applicant: Apple Inc., Cupertino, CA (US)

(72) Inventors: James R. Wilson, Cupertino, CA (US); Christopher D. Jones, Los Gatos, CA (US); Martin Melcher, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 305 days.

(21) Appl. No.: 15/631,348

(22) Filed: Jun. 23, 2017

Related U.S. Application Data

(60) Provisional application No. 62/380,168, filed on Aug. 26, 2016.

(51) Int. Cl.

| | | |
|---|---|---|
| *B32B 3/10* | (2006.01) | |
| *H01B 1/02* | (2006.01) | |
| *H01L 27/14* | (2006.01) | |
| *H01L 31/0224* | (2006.01) | |
| *H01L 31/18* | (2006.01) | |
| *H01L 33/38* | (2010.01) | |
| *H01L 51/00* | (2006.01) | |
| *H01L 51/52* | (2006.01) | |
| *H05K 3/24* | (2006.01) | |
| *B60J 1/00* | (2006.01) | |

(52) U.S. Cl.
CPC ............... *H01B 1/02* (2013.01); *H01L 27/14* (2013.01); *H01L 31/022466* (2013.01); *H01L 31/1884* (2013.01); *H01L 33/38* (2013.01); *H01L 51/0021* (2013.01); *H01L 51/5212* (2013.01); *H05K 3/249* (2013.01); *B60J 1/001* (2013.01)

(58) Field of Classification Search
None
See application file for complete search history.

(56) References Cited

U.S. PATENT DOCUMENTS

| | | |
|---|---|---|
| 4,786,784 A | 11/1988 | Nikodem et al. |
| 5,005,020 A | 4/1991 | Ogawa et al. |
| 6,906,842 B2 | 6/2005 | Agrawal et al. |
| 7,186,952 B2 * | 3/2007 | Degand .................. H05B 3/84 219/202 |
| 8,022,333 B2 | 9/2011 | Maeuser |

* cited by examiner

*Primary Examiner* — Christopher M Polley
(74) *Attorney, Agent, or Firm* — Treyz Law Group, P.C.; G. Victor Treyz

(57) ABSTRACT

A system such as a vehicle may have windows. A window may have rigid clear layers such as layers of glass or rigid polymer. A polymer layer may be interposed between the rigid clear layers to form a laminated window structure. A conductive layer such as a silver layer or other metal layer in the window may be configured to block infrared light. The conductive layer may be patterned to form signal paths, a radio-transparent region, and other structures in a window. The conductive layer may be formed as a coating on a rigid clear window layer or may be formed on other window structures. The conductive layer may be patterned by removing conductive material from areas of the conductive layer. An insulating layer that visually matches the conductive layer may be formed in these areas without overlapping the conductive area.

20 Claims, 12 Drawing Sheets

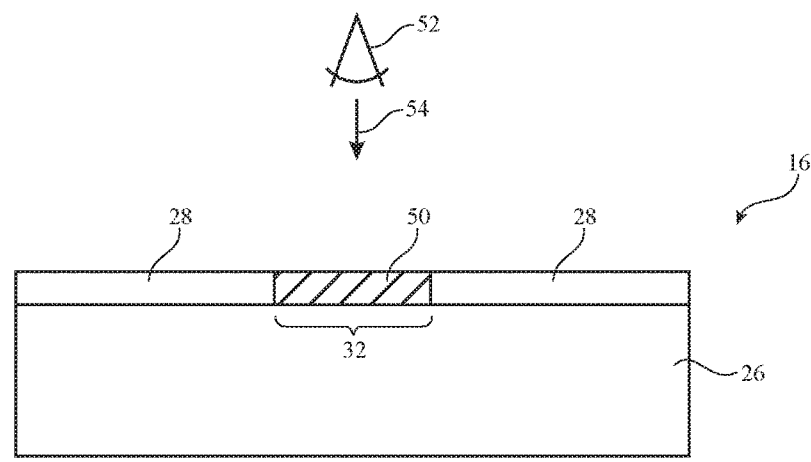
FIG. 8
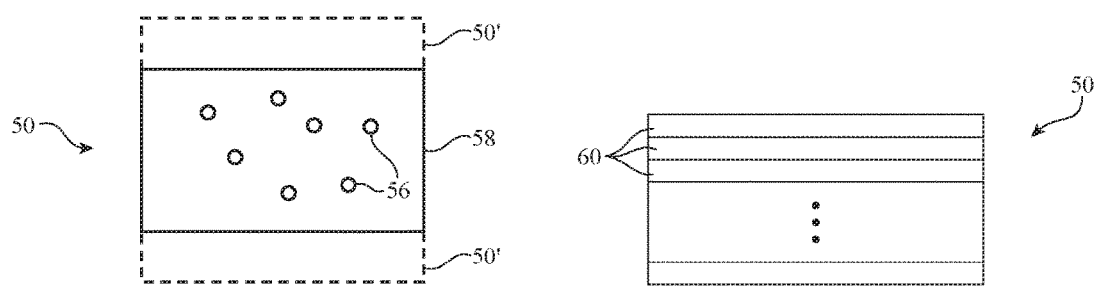
FIG. 9
FIG. 10

WINDOWS WITH INVISIBLE PATTERNED CONDUCTIVE LAYERS

This application claims the benefit of provisional patent application No. 62/380,168, filed on Aug. 26, 2016 which is hereby incorporated by reference herein in its entirety.

FIELD

This relates generally to patterned conductive layers, and, more particularly, to hiding patterned conductive layers such as patterned conductive layers within vehicle windows.

BACKGROUND

Vehicle windows sometimes include conductive layers such as layers of silver. The conductive layers provide the windows with the ability to shield vehicle occupants from infrared light. Vehicle windows with infrared-light-blocking capabilities may help avoid excessive heat buildup when vehicles are exposed to sunlight.

Vehicle windows that are entirely covered with conductive layers tend to block wireless communications. It may therefore be desirable to form openings in the conductive layers in vehicle windows. Patterning these layers may, however, create unattractive visible artifacts.

SUMMARY

A system such as a vehicle may have windows. A window may have rigid clear layers such as layers of glass or rigid polymer. A polymer layer may be interposed between the rigid clear layers to form a laminated window.

A conductive layer such as a silver layer or other metal layer in the window may be used to block infrared light. The conductive layer may be patterned to form signal paths, a radio-transparent region, and other structures in a window. Radio-transparent regions may allow radio-frequency signals to pass through the window between an interior region of the vehicle and an exterior region surrounding the vehicle.

The conductive layer may be formed as a coating on a rigid clear window layer or may be formed on other window structures. The conductive layer may be patterned by removing conductive material from areas of the conductive layer using laser processing, lift-off, or other patterning techniques.

An insulating layer that visually matches the conductive layer may be formed in the areas of the window from which the conductive material of the conductive layer has been removed. The insulating material may have optical properties that are matched to the optical properties of the conductive layer, making the patterning of the conductive layer invisible and unnoticeable to an unaided eye. The insulating material may be patterned so that it does not overlap the conductive layer.

BRIEF DESCRIPTION OF THE DRAWINGS

FIG. 8 is a cross-sectional side view of an illustrative window having a patterned conductive layer with opening filled with a material that reduces the visibility of the patterned conductive layer in accordance with an embodiment.

FIGS. 9 and 10 are cross-sectional side view of illustrative visually match insulator layer structures for reducing the visibility of conductive layer patterns in windows in accordance with embodiments.

DETAILED DESCRIPTION

A system may have windows with one or more structural layers such as layers of glass or rigid plastic. The windows may also include thin-film layers. Conductive layers such as silver layers may, for example, be incorporated into windows to block infrared light.

The conductive layers may be patterned using laser patterning techniques, lift-off techniques, or other patterning techniques. Patterned conductive layers may have gaps or other areas where conductive material has been removed. The areas of the patterned conductive layers where conductive material has been removed may be backfilled with insulating material having the same visual appearance as the conductive layer material. This makes the patterns of the conductive layers invisible to a user of the system.

Figure 1:
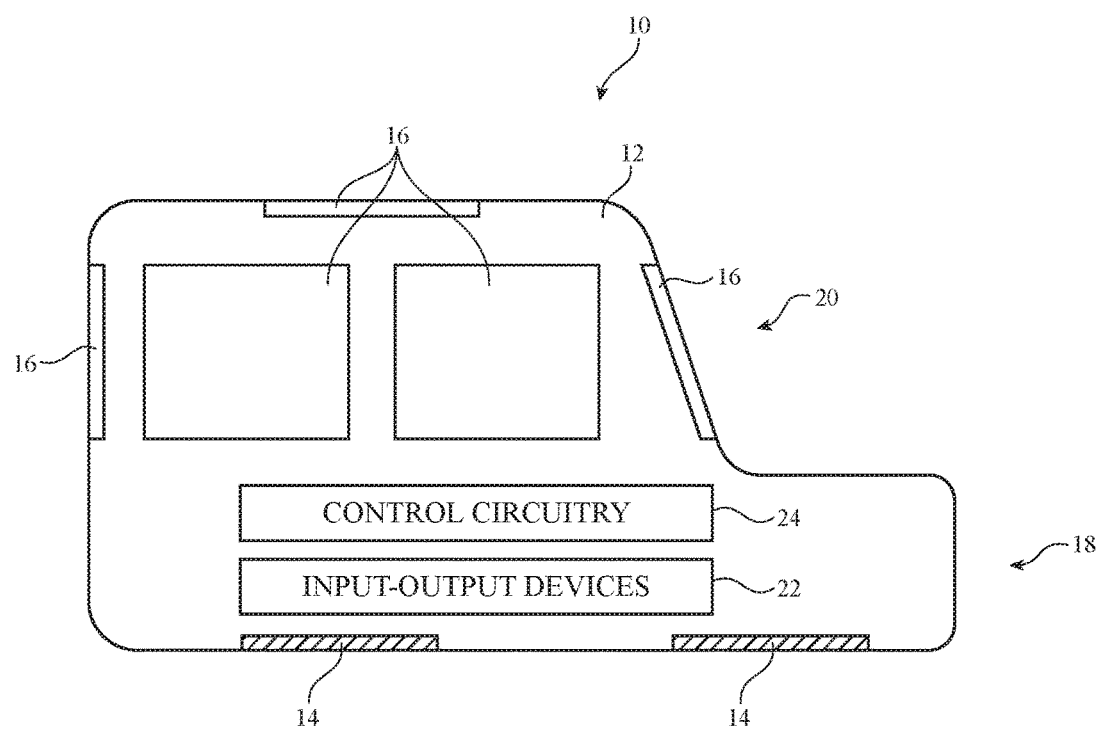
FIG. 1 is a schematic diagram of an illustrative system in accordance with an embodiment.

An illustrative system with windows is shown in FIG. 1. As shown in FIG. 1, system 10 may be a vehicle having portions such as portions 18 and 20. Portion 18 may include wheels 14, a body such as body 12 with a chassis to which wheels 14 are mounted, propulsion and steering systems, and other vehicle systems. Body 12 may include doors, trunk structures, a hood, side body panels, a roof, and/or other body structures. Seats may be formed in the interior of vehicle 10. Portion 20 may include windows such as window(s) 16. Window 16 and portions of body 12 may separate the interior of vehicle 10 from the exterior environment that is surrounding vehicle 10.

Windows 16 may include front windows on the front of vehicle 10, a moon roof window or other window extending over some or all of the top of vehicle 10, rear windows on the rear of vehicle 10, and side windows on the sides of vehicle 10. Windows 16 may be formed from one or more layers of transparent glass, clear rigid polymer (e.g., polycarbonate), polymer adhesive layers, and/or other layers. In some arrangements, window(s) 16 may include laminated window structures such as one or more transparent layers (glass, rigid polymer, etc.) with interposed polymer layer(s). The polymer in a laminated window may be, for example, a polymer such as polyvinyl butyral (PVB) or ethylene-vinyl acetate (EVA).

Conductive layers and other layers of material may also be incorporated in windows 16. If desired, air gaps may be formed between the transparent layers of material in a window. Adjustable layers (e.g., light modulator layers, etc.) may also form part of windows 16. With one suitable arrangement, windows 16 are vehicle windows and include one or more glass layers with optional laminating polymer and include one or more patterned conductive layers and visually matched backfill insulator. This type of arrangement may sometimes be described herein as an example. Other types of window structures may be used and these window structures may be used in buildings or other systems in addition to vehicles.

Vehicle 10 may include control circuitry 24 and input-output devices 22. Control circuitry 24 may include storage and processing circuitry for supporting the operation of vehicle 10. The storage and processing circuitry may include storage such as hard disk drive storage, nonvolatile memory (e.g., electrically-programmable-read-only memory configured to form a solid state drive), volatile memory (e.g., static or dynamic random-access-memory), etc. Control circuitry 24 may also include processing circuitry based on one or more microprocessors, microcontrollers, digital signal processors, baseband processors, power management units, audio chips, application specific integrated circuits, etc.

Processing circuitry in control circuitry 24 may be used to control the operation of vehicle 10 and the components in vehicle 10 (e.g., components associated with windows 16 and input-output components 22, etc.). For example, control circuitry 24 can apply current to a patterned conductive layer in a window to ohmically heat the window (e.g., to defrost the window). As another example, control circuitry 24 can route signals such as power signals and/or data signals through signal traces formed from a patterned conductive layer. If desired, control circuitry 24 and input-output devices 22 may include radio-frequency transceiver circuitry and antennas for transmitting and receiving wireless signals. Regions of conductive layers in windows 16 may be patterned to make these regions radio-transparent and capable of passing radio-frequency antenna signals transmitted and received by the antennas.

Input-output devices 22 may be used to gather data for vehicle 10, may be used to gather information from a user (vehicle occupant, etc.) of vehicle 10, may be used to provide data from vehicle 10 to external systems or a user, and/or may be used in handling other input and output operations. Input-output devices 22 may include buttons, scrolling wheels, touch pads, key pads, keyboards, and other user input devices. Microphones may be used to gather voice input from a user and may gather information on ambient sounds. Devices 22 may include ambient light sensors, proximity sensors, magnetic sensors, force sensors, accelerometers, image sensors, and/or other sensors for gathering input. Output may be supplied by devices 22 using audio speakers, tone generators, vibrators, haptic devices, displays, light-emitting diodes and other light sources, and other output components. Vehicle 10 (e.g., devices 22, etc.) may include wired and wireless communications circuitry that allows vehicle 10 (e.g., control circuitry 24) to communicate with external equipment and that allows signals to be conveyed between components (circuitry) at different locations in vehicle 10.

Figure 2:
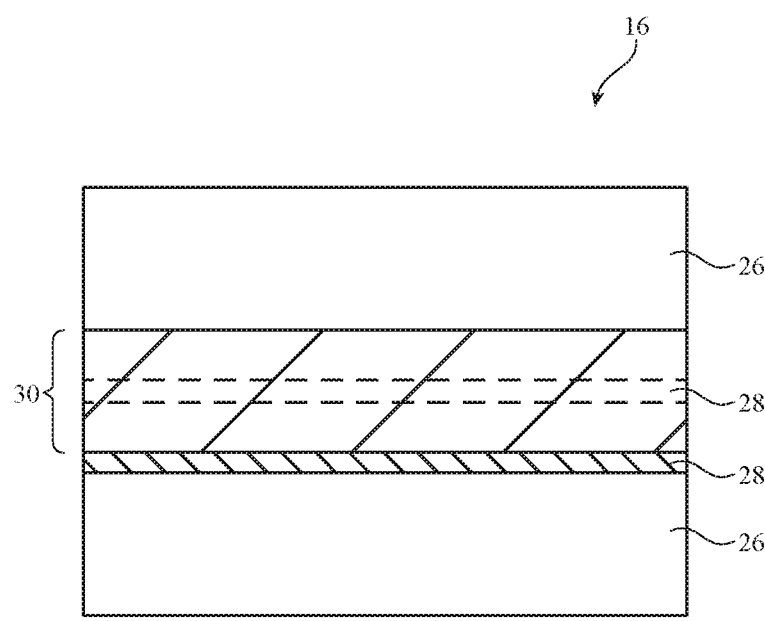
FIG. 2 is a cross-sectional side view of an illustrative window in accordance with an embodiment.

A cross-sectional side view of an illustrative window is shown in FIG. 2. As shown in FIG. 2, window 16 may include one or more transparent structural layers such as layers 26. Two layers 26 are included in window 16 in the example of FIG. 2, but more than two layers or fewer than two layers may be included in window 16, if desired. Layers 26 may be clear layers of rigid polymer, glass, or other transparent material. Polymer layer 30 (e.g., a PVB layer, an EVA layer, or other polymer layer) may be used to couple layers 26 together. One or more layers such as layer 28 may be included in window 16. Layer 28 may be a metal layer such as a silver layer (e.g., a silver layer of 3-25 nm in thickness, of 5-20 nm in thickness, of more than 2 nm in thickness, of less than 30 nm in thickness, etc.) or other conductive layer that serves as an infrared-light blocking filter.

Layer 28 may be formed as a coating on one or both of layers 26 (e.g., on a surface of layer(s) 26 facing polymer layer 30). If desired, layer 28 may be embedded within layer 30. Layer 28 may be formed form an elemental metal (e.g., silver, aluminum, titanium, etc.), from a metal alloy, from a thin-film stack including multiple layers of metal and dielectric (e.g., a thin-film stack that forms a low thermal emissivity coating layer or other infrared light blocking filter), may be formed on a polymer carrier film that is embedded within layer 30 or attached to the surface of one of layers 26, or may be formed using other suitable structures.

Figure 3:
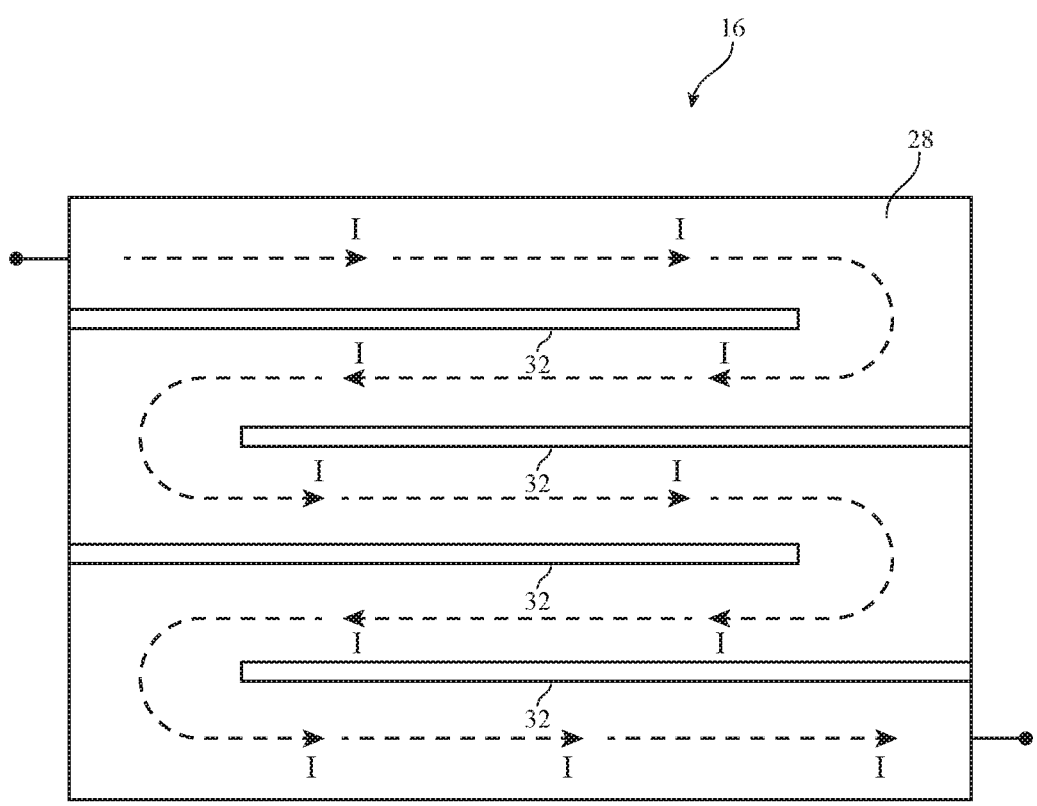
FIG. 3 is top view of an illustrative window with a patterned conductive layer forming a serpentine ohmic heating element in accordance with an embodiment.

Layer 28 may be patterned using laser etching or other patterning techniques (photolithography and etching, lift-off, etc.). In the example of FIG. 3, layer 28 on window 16 has been patterned by forming areas 32 from which the material of layer 28 has been removed. Areas 32 of FIG. 3 form elongated slot-shaped gaps, so that the unremoved conductive material of layer 28 forms a serpentine ohmic heating current path. When it is desired to heat window 16 (e.g., for defrosting), control circuitry 24 can apply a current I to this path. Ohmic heating signal paths of other shapes may be formed in layer 28 of window 16 if desired. The creation of a serpentine shape for layer 28 by removing strips of material in areas 32 is illustrative.

Figure 4:
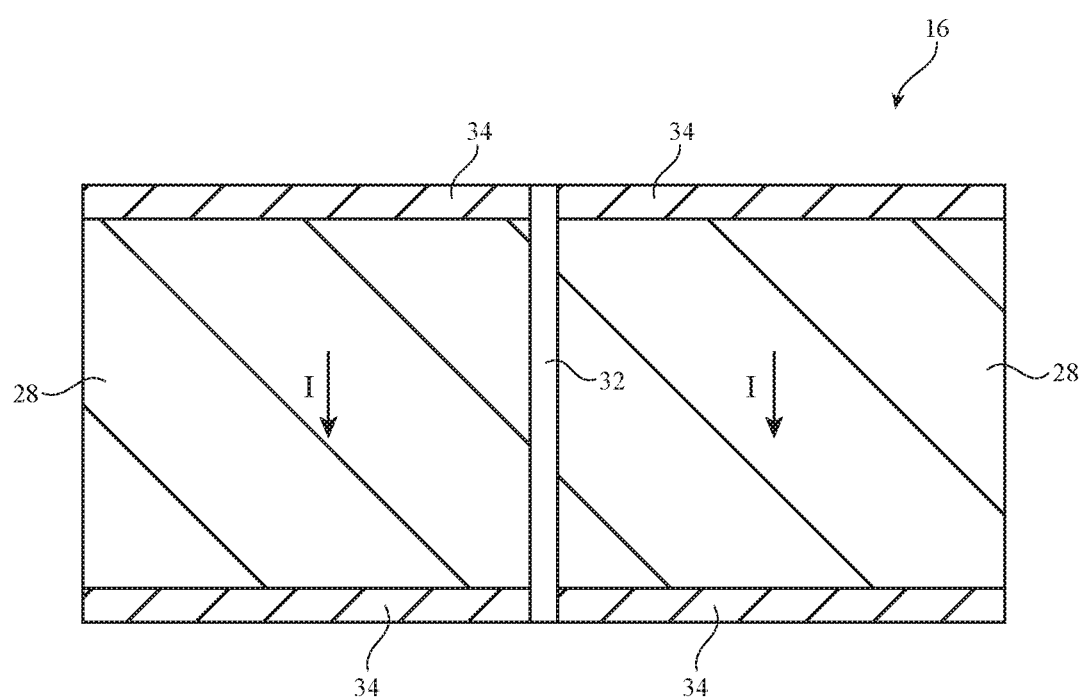
FIG. 4 is a top view of an illustrative window with a patterned conductive layer having left and right portions separated by a gap in accordance with an embodiment.

As shown in FIG. 4, layer 28 may be divided into regions (e.g., right and left halves of window 16) for independent ohmic heating (e.g., for defrosting) by removing the conductive material of layer 28 in a vertical strip (area 32). Busbars 34 or terminals of other shapes may be used to apply currents I to the left and right halves of layer 28.

Figure 5:
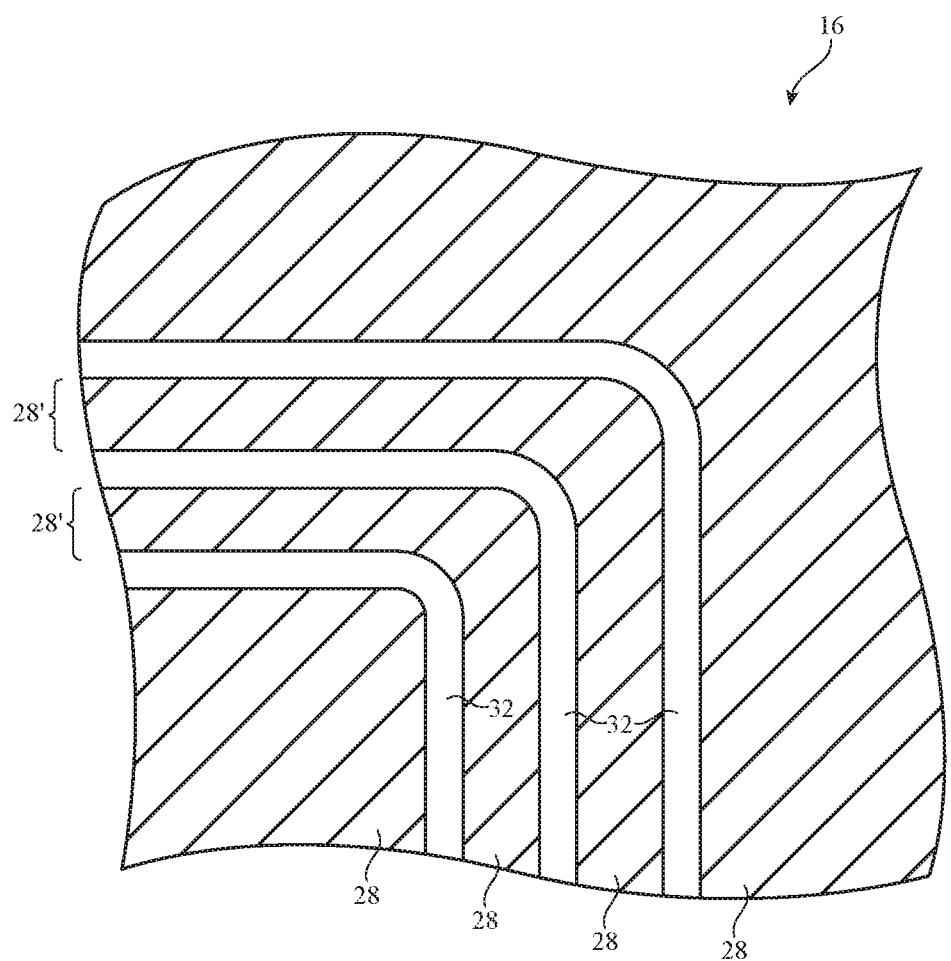
FIG. 5 is a top view of an illustrative window with a conductive layer that has been patterned to form signal traces for data and/or power in accordance with an embodiment.

In the example of FIG. 5, elongated signal paths 28' (e.g., signal lines in a data bus, power lines, etc.) have been formed by creating elongated strip-shaped areas 32 from which the conductive material of layer 28 in window 16 has been removed.

Figure 6:
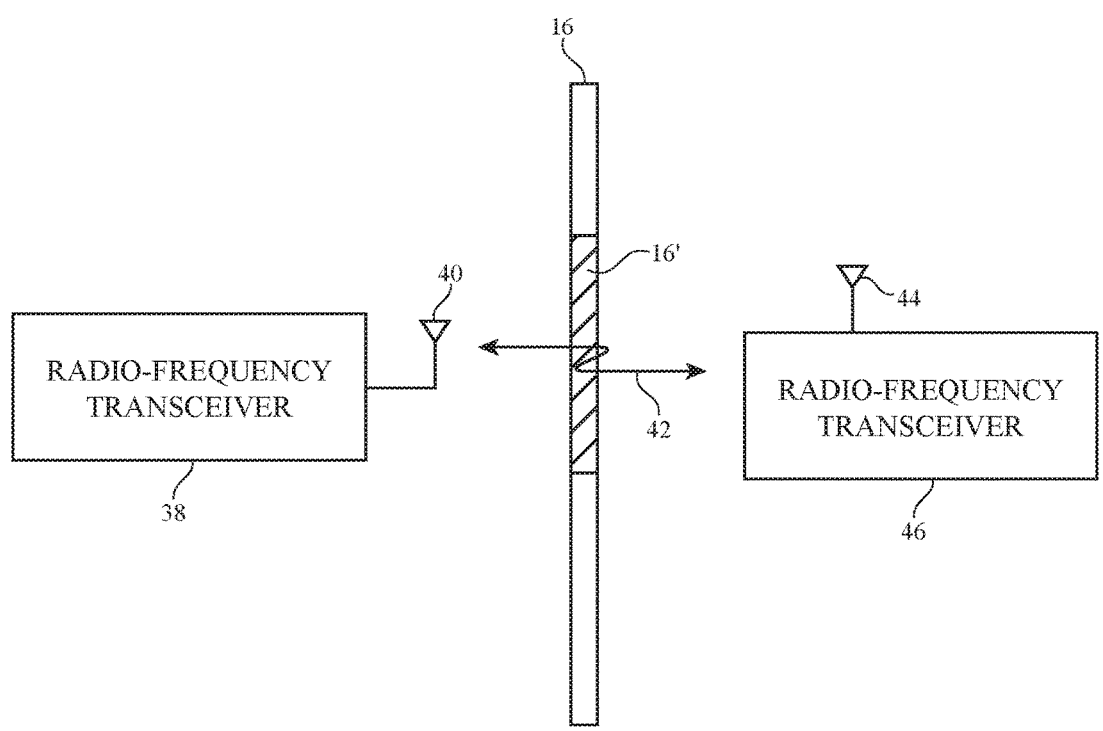
FIG. 6 is a cross-sectional side view of an illustrative window with a conductive layer that has been patterned to form a radio-transparent region in accordance with an embodiment.

FIG. 6 is a cross-sectional side view window 16 showing how a region of window 16 (region 16') may be modified to make region 16' radio-transparent. Other portions of window 16 may include conductive material (i.e., unpatterned material from layer 28) that fully or partially blocks radio-frequency signals and thereby renders those portions of window 16 not radio-transparent or at least less radio-transparent than region 16' (i.e., region 16' may be more radio-transparent than the other portions of window 16). In region 16', all of the conductive material from layer 28 may be removed or conductive material may be removed from an area of layer 28 in a pattern. As illustrated in FIG. 6, this allows internal radio-frequency transceiver circuitry 38 and internal antenna 40 in the interior of vehicle 10 to transmit and receive radio-frequency signals 42 that pass through region 16' and thereby allows internal radio-frequency transceiver circuitry 38 and internal antenna 40 to wirelessly communicate with external radio-frequency transceiver circuitry 46 and external antenna 44 in an external region surrounding vehicle 10 (i.e., region 16' may be radio-transparent).

Figure 7:
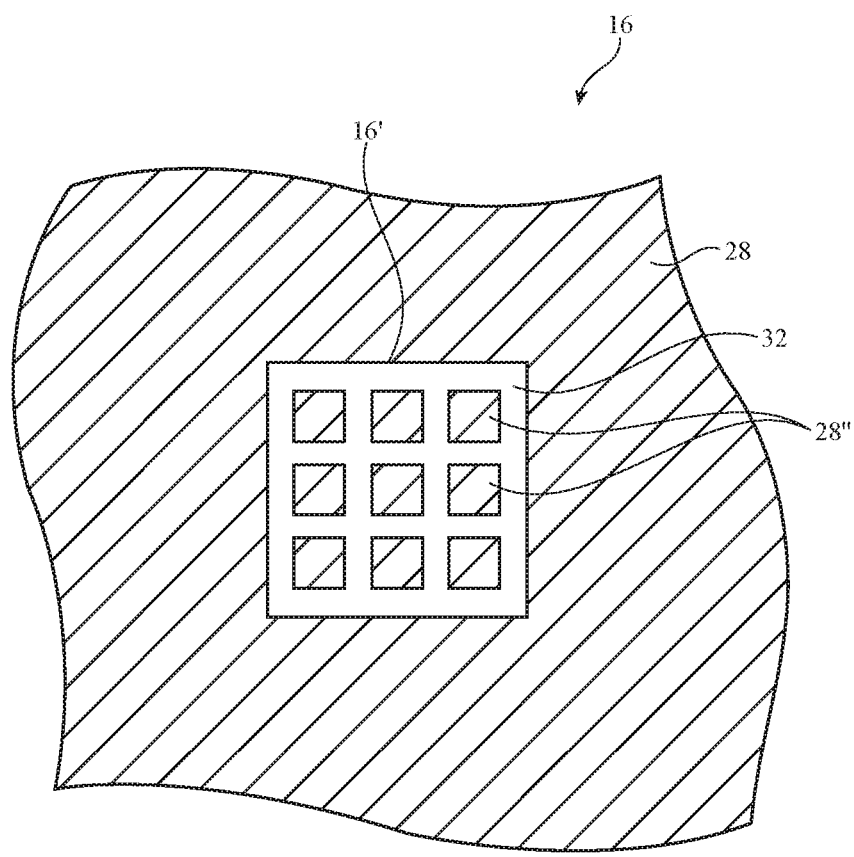
FIG. 7 is a diagram of a portion of a window having a conductive layer with an illustrative radio-transparent region in accordance with an embodiment.

As shown in FIG. 7, radio-transparent region 16' may have a grid-shaped area 32 from which the conductive material of conductive layer 28 on window 16 has been selectively removed (e.g., by laser processing, photolithography, etc.). Area 32 may have any suitable shape (e.g., area 32 may include combinations of slots, polygons, grids, and/or other suitable shapes that render region 16' radio-transparent and allow radio-frequency wireless signals to pass through region 16'). The inclusion of regions such as region 16' in one or more windows 16 of vehicle 10 allows occupants of vehicle 10 to use cellular telephones and other portable electronic devices in the interior of vehicle 10 (e.g., devices that transmit and receive signals through region 16' during use).

As these examples demonstrate, it may be desirable to remove areas 32 of layer 28. Layer 28 may be formed from a thin layer of conductive material (e.g., a silver layer of 3-25 nm in thickness, of 5-20 nm in thickness, of more than 2 nm in thickness, of less than 30 nm in thickness, etc.). Layer 28 may be sufficiently thin to allow desired amounts of visible light to pass through windows 16 while blocking 30% or more, 60% or more, or 90% or more of near infrared light. Due to the presence of layer 28, the transmission of layer 28 will be less than 100% at visible wavelengths. As an example, the visible light transmission of layer 28 may be 70-95%, less than 90%, less than 80%, more than 40%, and/or other suitable amounts. If care is not taken, the patterning of layer 28 (the pattern of removed-material area 32) may be noticeable to the occupants of vehicle 10 or an external observer. To make patterned layer 28 less noticeable while preserving the insulating quality of areas 32 (so as not to create short circuits across areas 32), areas 32 may be backfilled with dielectric (insulating) structures that match the appearance of layer 28.

Consider, as an example, the scenario of FIG. 8. In the example of FIG. 8, layer 26 has been coated with patterned layer 28. Layer 28 has an area 32 from which the material of layer 28 has been selectively removed. To make this patterning less visible, area 32 may be filled with a material such as insulating layer 50. Insulating layer 50 may be a dielectric such as an inorganic dielectric (an oxide, nitride, etc.) or and organic material (e.g., a polymer). The thickness of layer 50 may match the thickness of layer 28 or layer 50 may be thinner or thicker than layer 28.

An observer such as viewer 52 may view window 16 in direction 54. To hide area 32 from view (i.e., to obscure the patterning of layer 28 so that the patterning of layer 28 is invisible and thereby unnoticeable to the unaided eye), the optical properties of layer 50 may be matched to those of layer 28. One or more parameters such as visible reflectivity, visible-light transmission, and/or color for layer 50 may be matched to those of layer 28 within 30%, within 20%, within 10%, within 5%, within between 5-40%, or within any other suitable amount. Window 16 may include the structure of FIG. 8 and, if desired, additional layers (e.g., an additional layer 26, a PVB layer or EVA layer, etc.). The configuration of FIG. 8 is shown as an example.

Layer 50 may be formed from a single layer of material, two layers of material, or more than two layers of material.

As shown in FIG. 9, layer 50 may include a polymer, glass, inorganic material, or other material 58 that includes additives 56. Additives 56 may include inorganic and organic pigments, light-scattering and light-absorbing particles (e.g., carbon particles, metal oxide particles, etc.), and/or other materials that alter the color, optical density, and reflectivity of layer 50. If desired, additional layers 50' (e.g., thin-film dielectric stacks, bulk films, and/or other materials) may be added above and/or below material 58. As shown in the example of FIG. 10, layer 50 may include a thin-film dielectric stack formed form multiple thin-film layers 60 (e.g., silicon oxide, titanium dioxide, silicon nitride, and/or other inorganic dielectric layers). Layers 60 may form a thin-film interference filter with a desired transmission, reflectivity, and color. Layer 50 may be, for example, a film with alternating high refractive index and low refractive index dielectric layers 60, a film with other thin-film interference filter configurations, semiconductor layers, amorphous materials, polymers, inorganic materials, or other suitable materials.

Figure 11:
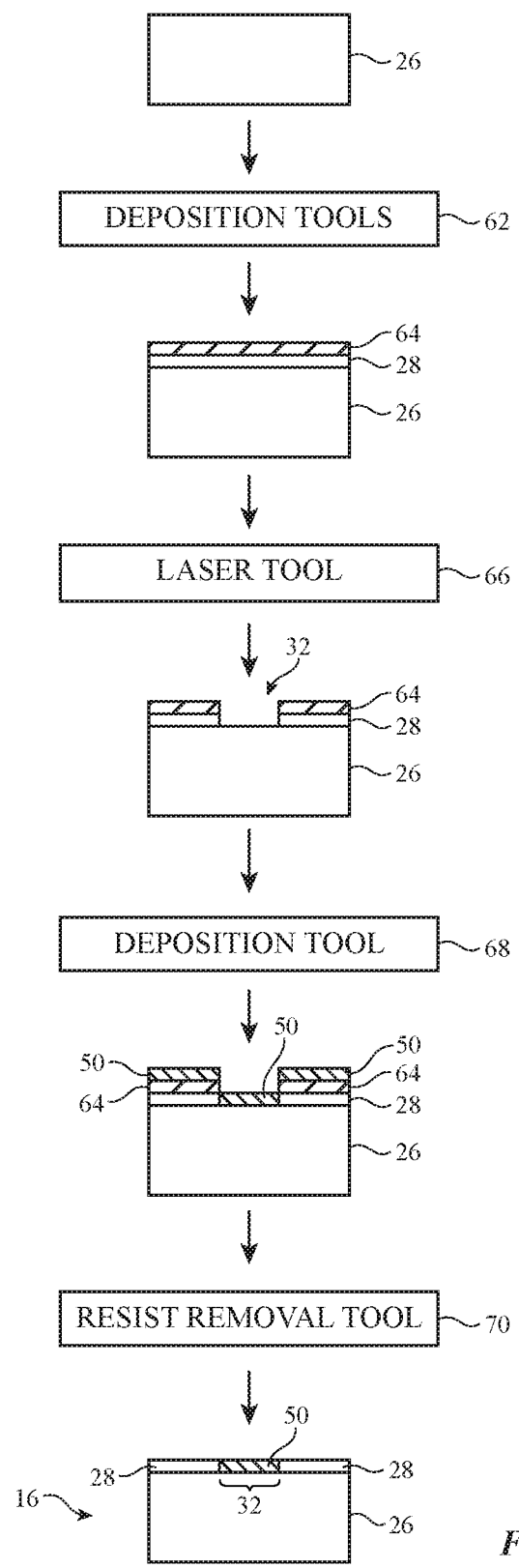
FIGS. 11 and 12 are diagrams of illustrative equipment and operations of the type that may be used to form windows with patterned conductive layers in accordance with embodiments.

FIG. 11 is a diagram of illustrative equipment and operations that may be used in forming windows with patterned conductive layers such as layer 28.

As shown in FIG. 11, a window layer such as layer 26 may be coated with layer 28 and photoresist layer 64 using deposition tools 62. Layer 28 may be deposited using physical vapor deposition, chemical vapor deposition, or other suitable deposition techniques. Layer 64 may be applied by spraying or other suitable photoresist deposition techniques.

Following deposition of layers 28 and 64, a patterning tool such as laser tool 66 (e.g., a visible laser, infrared laser, or ultraviolet laser) may supply continuous-wave and/or pulsed laser light that selectively removes portions of layer 28 and 64 in area 32.

Deposition tool 68 may then deposit layer 50. Deposition tool 68 may be a physical vapor deposition tool, a chemical vapor deposition tool, a tool that deposits material using spinning, spraying, pad printing, screen printing, spinning, slit coating, or other suitable deposition technique.

A step in height is created by patterning layers 28 and 64 with tool 66. As a result, when layer 50 is deposited by tool 68, a portion of layer 50 will form a coating on layer 26 at the bottom of the opening formed in area 32 and a portion of layer 50 will be formed on top of layer 64. Photoresist removal tool 70 (e.g., a tool that immerses layer 26 and the coatings on layer 26 in a solvent bath) may be used to remove photoresist 64 and thereby remove the portions of layer 50 that are not in area 32. This process, which may sometimes be referred to as a lift-off process, may be used to form a patterned layer of material 50 on layer 26 in area 32. The material of layer 50 does not overlap the material of layer 28 (in this example). Because layer 50 and layer 28 have matching appearances, the presence of layer 50 helps hide the patterning of layer 28 from view.

Figure 12:
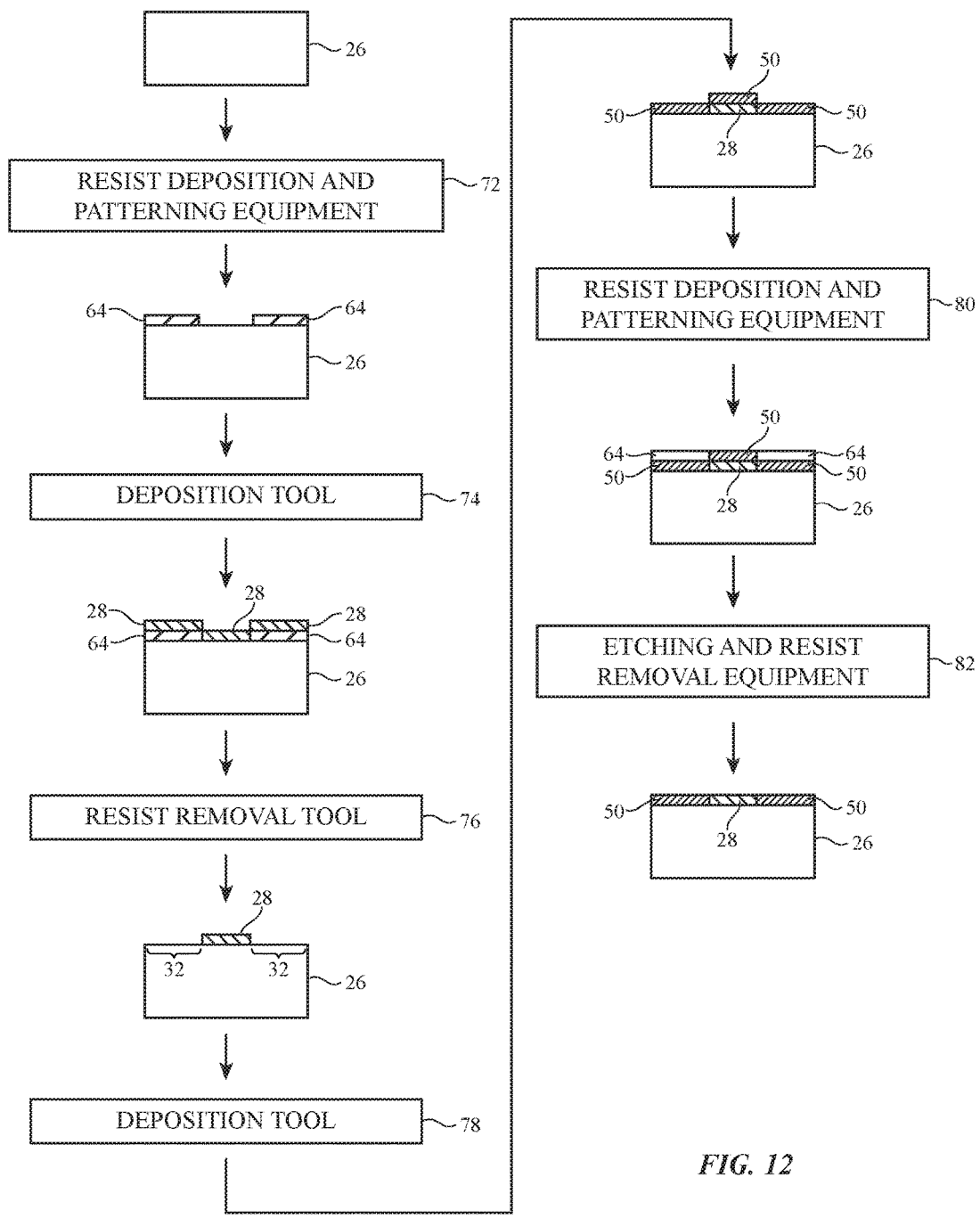

A diagram of additional illustrative equipment and operations that may be used in forming windows with patterned conductive layers such as layer 28 is shown in FIG. 12.

As shown in FIG. 12, a window layer such as layer 26 may be coated with a patterned photoresist layer 64 using equipment 72. Equipment 72 may include photoresist deposition equipment (e.g., spraying equipment, etc.) and may include photoresist patterning equipment (e.g., a laser tool, photolithographic equipment for exposing and developing photoresist 64, etc.).

Deposition tool 74 (e.g., a physical deposition tool, a chemical vapor deposition tool, etc.) may be used to deposit layer 28 on layer 64. Resist removal tool 76 (e.g., a photoresist solvent bath) may then remove photoresist 64 and the portions of layer 28 on resist 64 using lift off. This patterns layer 28 and creates areas 32 where layer 28 is not present.

Tool 78 may deposit layer 50 on top of patterned layer 28. Tool 78 may be a physical vapor deposition tool, a chemical vapor deposition tool, a spraying tool, a tool for applying the material of layer 50 by dripping, spinning, slit coating, or other suitable deposition techniques.

Resist deposition and patterning equipment 80 (e.g., a tool for depositing photoresist by spraying or other suitable technique and a laser, photolithography tool, or other equipment for patterning the deposited photoresist) may be used to form a patterned layer of photoresist 64 after layer 50 has been deposited.

Etching and photoresist removal equipment 82 may preferentially etch the material of layer 50 while not etching away layer 28 (e.g., equipment 82 may etch away layer 50 using a material that removes layer 50 without attacking photoresist layer 64 and without excessively etching the material of layer 28). Following removal of layer 50 in the areas not protected by photoresist 64, photoresist 64 may be stripped (e.g., using a solvent that dissolves photoresist). This leaves patterned layers 28 and 50 on layer 26.

If desired, coatings of the type described in connection with FIGS. 11 and 12 may be formed on plastic carrier films and embedded in layer 30 (FIG. 2), may be formed on multiple layers 26 in window 16, and/or may be formed in other portions of window 16. Windows 16 may include a single layer 26 and/or multiple layers 26 (e.g., layers 26 that are coupled together using layer 30 of FIG. 2).

Figure 13:
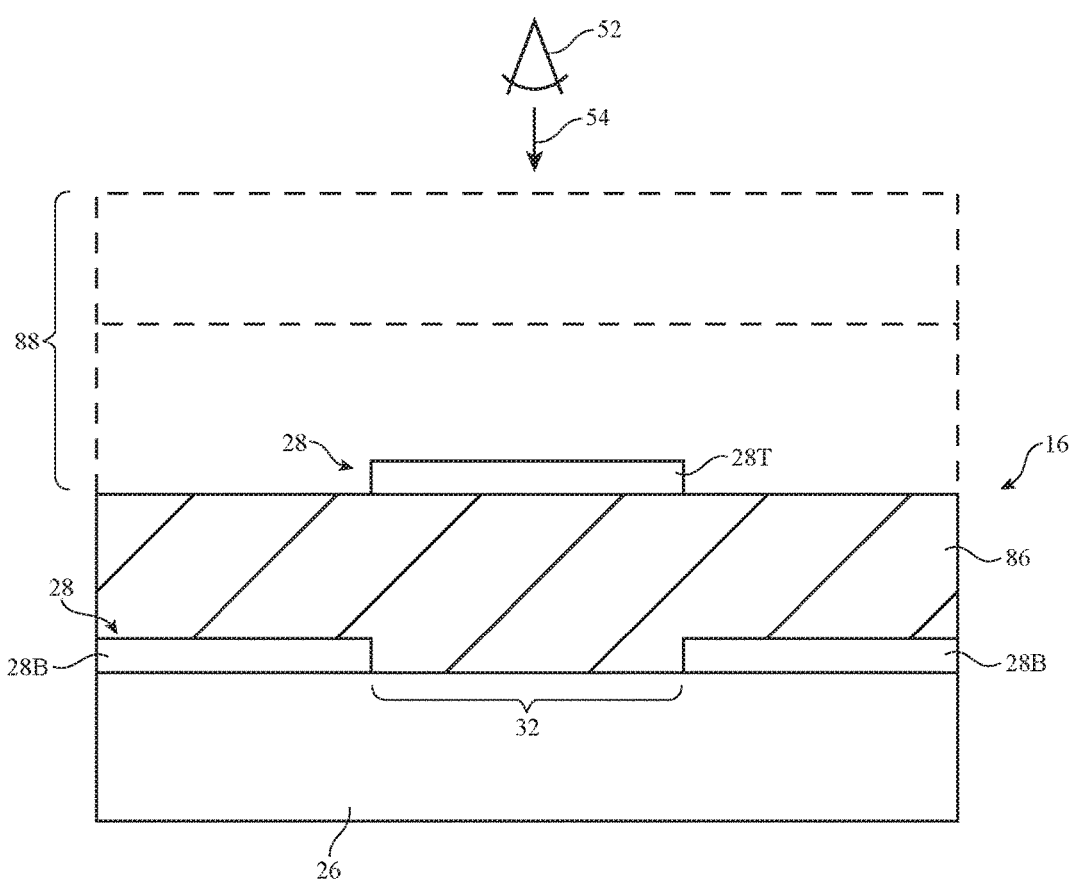
FIG. 13 is a cross-sectional side view of a portion of an illustrative window with multiple overlapping patterned conductive layers in accordance with an embodiment.

FIG. 13 shows how multiple conductive layers 28 may be formed in window 16. In the example of FIG. 13, there are two layers 28: lower layer 28B and upper layer 28T. Additional layers 28 may be included in window 16, if desired.

Different layers 28 in window 16 may be patterned using complementary patterns (or nearly complementary patterns). For example, the lower layer 28B in FIG. 13 may have an opening in area 32 and upper layer 28 may be patterned to have a shape and layout that covers area 32 (and, if desired, overlaps area 32 and parts of lower layer 28B). Because the material of the upper layer 28T overlaps area 32 from which the material of the lower layer 28B has been removed, window 16 will not have any substantial visible areas 32 when viewed in direction 54 by viewer 52. Dielectric 86 (e.g., one or more inorganic and/or organic layers such as oxide layers, polymer layers, etc.) may be used to separate layers 28B and 28T from each other. Additional layers 88 (e.g., additional layers 26, PVA or EVA layers, etc.) may be incorporated into window 16, if desired.

Figure 14:
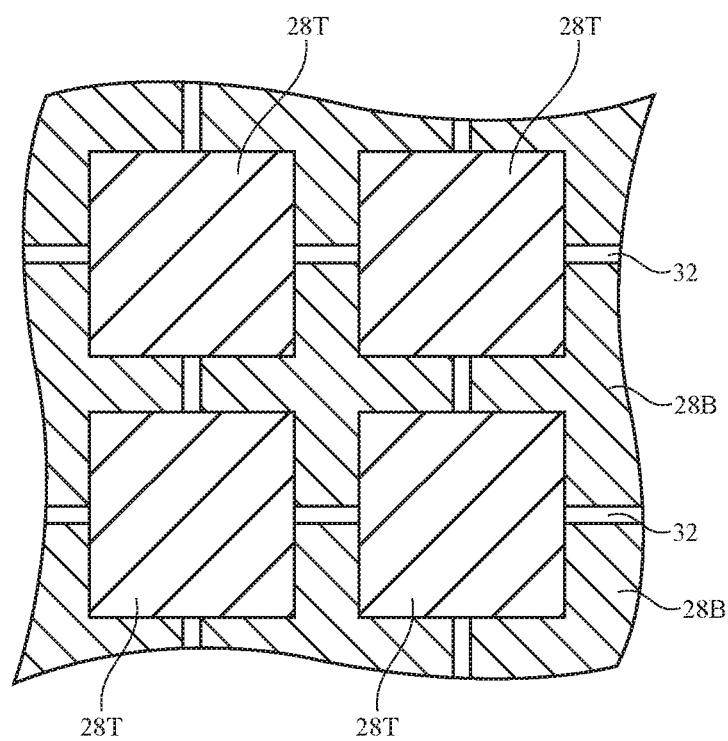
FIG. 14 is a cross-sectional side view of an illustrative radio-transparent region in a window with multiple conductive layers in accordance with an embodiment.

A top view of a portion of an illustrative window such as window 16 is shown in FIG. 14. This type of multilayer structure may be used to form a radio-transparent region 16' in window 16 and/or may be used to form other structures where it is desirable to pattern one or more layer 28 (e.g., to form data or power traces, etc.). In the example of FIG. 14, upper layer 28T has an array of patches that overlap and underlying array of openings 32 (e.g., identical patch shaped openings) in lower layer 28B. If desired, slit-shaped areas 32 may be used to help ensure that layer 28B in FIG. 14 is segmented (e.g., to improve radio-transparency). Other multi-layer patterns may be used for forming windows with multiple conductive layers 28, if desired (e.g., patterns without slit-shaped areas 32 and patterns in which areas 32 in layer 28B are completely overlapped by layer 28T). The arrangement of FIG. 14 is illustrative.

The foregoing is merely illustrative and various modifications can be made to the described embodiments. The foregoing embodiments may be implemented individually or in any combination.

What is claimed is:

1. A vehicle, comprising:
   a vehicle body having an interior; and
   a window in the body through which light passes to the interior, wherein the window has at least one rigid transparent layer and a conductive layer, wherein the conductive layer is patterned to form a patterned area without conductive material, wherein the window includes an insulating layer, wherein the insulating layer is in the patterned area without the conductive material and does not overlap the conductive material, and wherein the insulating layer is visually matched to the conductive layer so that the patterned area is not visible to an unaided eye.

2. The vehicle defined in claim 1 wherein the conductive layer is a metal layer that blocks infrared light.

3. The vehicle defined in claim 2 wherein the insulating layer in the patterned area and the metal layer have respective transmissions that are within 10% of each other.

4. The vehicle defined in claim 2 wherein the insulating layer comprises an inorganic layer.

5. The vehicle defined in claim 2 wherein the insulating layer comprises a dielectric stack having layers of different refractive indices.

6. The vehicle defined in claim 2 wherein the insulating layer comprises a polymer with a pigment.

7. The vehicle defined in claim 2 wherein the metal layer is a silver layer.

8. The vehicle defined in claim 2 wherein the window includes an additional rigid transparent layer and a polymer layer that attaches the rigid transparent layer to the additional rigid transparent layer.

9. The vehicle defined in claim 8 wherein the metal layer is a coating on the rigid transparent layer.

10. The vehicle defined in claim 1 wherein the conductive layer comprises a coating on the rigid transparent layer and wherein the rigid transparent layer comprises a layer of glass.

11. The vehicle defined in claim 1 wherein the patterned conductive layer forms an ohmic heating current path.

12. The vehicle defined in claim 1 wherein the window has a first region that does not contain the patterned area, wherein the window has a second region that contains the patterned area, and wherein the second region is more radio-transparent than the first region.

13. The vehicle defined in claim 12 wherein the rigid transparent layer comprises a glass layer and wherein the conductive layer is a metal coating layer on the glass layer.

14. The vehicle defined in claim 1 wherein the patterned conductive layer is a metal coating layer on the rigid transparent layer, the vehicle further comprising:
   an additional patterned conductive layer; and
   a dielectric layer separating the metal coating layer and the additional patterned conductive layer, wherein the additional patterned metal conductive layer has portions that overlap the areas.

15. A vehicle window, comprising:
   a rigid transparent layer;
   a conductive infrared-light-blocking layer on the rigid transparent layer, wherein the conductive infrared-light-blocking layer on the rigid transparent layer is patterned to form areas without conductive material; and an insulating layer in the areas without the conductive material, wherein the insulating layer is visually matched to the conductive layer.

16. The vehicle defined in claim 15 wherein the insulating and the metal layer have respective reflectivities that are within 20% of each other.

17. The vehicle defined in claim 16 wherein the rigid transparent layer comprises a glass layer, the vehicle window further comprising:
an additional glass layer; and
a polymer layer between the glass layer and the additional glass layer, wherein the conductive infrared-light-blocking layer comprises a metal coating on the glass layer.

18. Apparatus, comprising:
a window having first and second glass layers, a layer of polymer that is interposed between the first and second glass layers, a metal coating on the first glass layer that is patterned to form areas without metal, and a patterned insulating layer in the areas without metal that does not overlap the metal coating, wherein the areas are configured to form a radio-transparent region of the window;
an antenna; and
radio-frequency transceiver circuitry that uses that antenna to transmit and receive wireless signals through the radio-transparent region.

19. The apparatus defined in claim 18 wherein the insulating layer and the metal coating have respective reflectivities that are within 10% of each other.

20. The apparatus defined in claim 19 wherein the metal coating is configured to block infrared light.

* * * * *